(12) United States Patent
Mizuno

(10) Patent No.: US 9,252,009 B2
(45) Date of Patent: Feb. 2, 2016

(54) LIQUID PROCESSING APPARATUS

(71) Applicant: Tokyo Electron Limited, Tokyo (JP)

(72) Inventor: Tsuyoshi Mizuno, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 113 days.

(21) Appl. No.: 13/846,981

(22) Filed: Mar. 19, 2013

(65) Prior Publication Data

US 2013/0269737 A1  Oct. 17, 2013

(30) Foreign Application Priority Data

Apr. 11, 2012 (JP) .................................. 2012-090620
Feb. 19, 2013 (JP) .................................. 2013-030214

(51) Int. Cl.
*H01L 21/67* (2006.01)
*H01L 21/687* (2006.01)
*H01L 21/02* (2006.01)

(52) U.S. Cl.
CPC .... *H01L 21/02041* (2013.01); *H01L 21/67028* (2013.01); *H01L 21/67051* (2013.01); *H01L 21/68792* (2013.01)

(58) Field of Classification Search
CPC .............. B08B 3/00; B08B 3/04; B08B 3/08; B08B 11/02
USPC ................................... 134/23, 157; 3/23, 157
See application file for complete search history.

(56) References Cited

U.S. PATENT DOCUMENTS

| | | | | |
|---|---|---|---|---|
| 6,663,245 B2 * | 12/2003 | Kim et al. | ...................... | 359/508 |
| 7,927,657 B2 * | 4/2011 | Kobayashi et al. | ........... | 427/240 |
| 8,479,753 B2 * | 7/2013 | Nanba et al. | ................... | 134/137 |
| 2008/0142051 A1 * | 6/2008 | Hashizume | ...................... | 134/23 |
| 2010/0144158 A1 * | 6/2010 | Ito et al. | ......................... | 438/758 |

FOREIGN PATENT DOCUMENTS

| | | | | |
|---|---|---|---|---|
| JP | 2002-261073 A | 9/2002 | | |
| JP | 2011-108732 A | 6/2011 | | |
| WO | WO9924749 | * | 5/1999 | .............. F16L 11/00 |

* cited by examiner

*Primary Examiner* — Michael Barr
*Assistant Examiner* — Rita Adhlakha
(74) *Attorney, Agent, or Firm* — Abelman, Frayne & Schwab

(57) ABSTRACT

A liquid processing apparatus according to the present disclosure includes: a substrate holding unit configured to horizontally hold a substrate; a rotation driving unit configured to rotate the substrate holding unit about a vertical axis; a processing liquid supply unit configured to supply a processing liquid to the substrate while the substrate is being rotated; an upper guide ring and a lower guide ring which are configured to be rotated together with the substrate holding unit, to surround the substrate, to be arranged vertically to overlap each other with a gap therebetween, and to guide the processing liquid scattered from the substrate; and a rotating cup configured to be rotated together with the substrate holding unit, and to receive and downwardly guide the guided processing liquid.

8 Claims, 11 Drawing Sheets

LIQUID PROCESSING APPARATUS

CROSS-REFERENCE TO RELATED APPLICATIONS

This application is based on and claims priority from Japanese Patent Application Nos. 2012-090620 and 2013-030214, filed on Apr. 11, 2012 and Feb. 19, 2013 with the Japan Patent Office, the disclosures of which are incorporated herein in their entireties by reference.

TECHNICAL FIELD

The present disclosure relates to a technology for discharging a processing liquid supplied to a rotating substrate.

BACKGROUND

In manufacturing processes of a semiconductor device, in which a stacked structure of an integrated circuit is formed on the surface of a substrate, such as for example, a semiconductor wafer (hereinafter, referred to as a "wafer"), there is known a single wafer liquid processing apparatus for removing, for example, dusts and native oxides by supplying an alkaline or acidic chemical liquid to the front surface (top surface) or the rear surface (bottom surface) of a rotating wafer.

As an example of such a liquid processing apparatus, there is an apparatus including an annular guide (hereinafter, referred to as a "guide ring") provided in the circumference of a wafer in such a manner that the guide leads to the height positions of front and rear surfaces of the wafer. See, e.g., Japanese Patent Application Laid-Open No. 2011-108732: paragraphs [0031] to [0032], and FIG. 4. The guide ring is rotated together with the wafer so that the processing liquid scattered from the front surface (the top surface) of the wafer is guided to the outside through the top surface of the guide ring, and also the processing liquid scattered from the rear surface (the bottom surface) of the wafer is guided to the outside through the bottom surface of the guide ring. As the processing liquid is guided to the outside of the wafer by the guide ring in this manner, the processing liquid may be suppressed from forming mists by being entrained to turbulent flow formed around the rotating wafer, and, after the liquid processing, the mists adhered to the wafer may be reduced.

However, on the peripheral edge of the wafer, an area chamfered to be slanted, called a bevel, is formed. In some cases, a processing liquid discharged along the bevel may not flow along the guide ring. Also, when flexure occurs in a wafer due to the large size of the wafer, the scattering direction of the processing liquid may be considerably changed. Thus, in some cases, the processing liquid may not flow along the guide ring. When the processing liquid does not flow along the guide ring, the processing liquid may collide with, for example, a liquid drain cup provided in the outside of the guide ring, thereby producing mists. Further, there is a possibility that the formed mists cannot be guided to the outside of the wafer, and thus may be a cause of polluting the wafer.

SUMMARY

The present disclosure provides a liquid processing apparatus including: a substrate holding unit configured to horizontally hold a substrate; a rotation driving unit configured to rotate the substrate holding unit about a vertical axis; a processing liquid supply unit configured to supply a processing liquid to the substrate during the rotation of the substrate; an upper guide ring and a lower guide ring which are configured to be rotated together with the substrate holding unit, to surround the substrate held by the substrate holding unit, to be arranged vertically to overlap each other with a gap therebetween, and to guide the processing liquid scattered from the substrate; and a rotating cup configured to be rotated together with the substrate holding unit, and to receive and downwardly guide the processing liquid guided by the upper guide ring and the lower guide ring.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
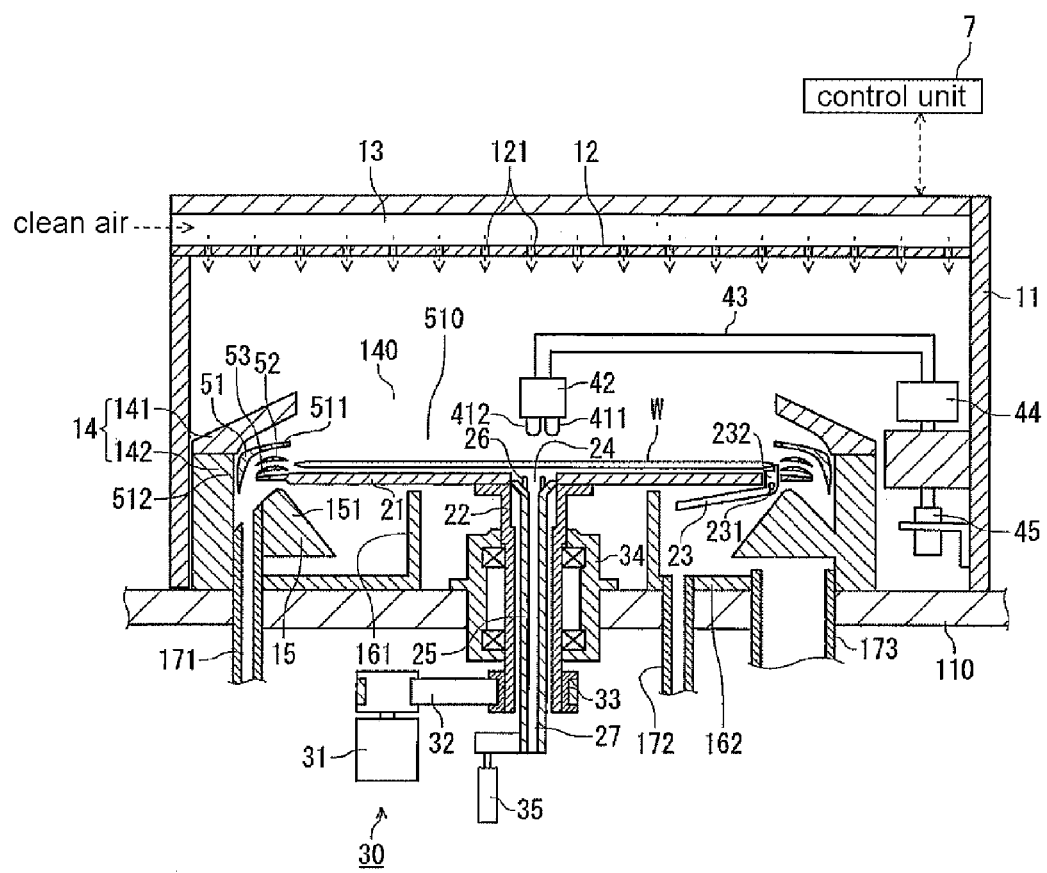
FIG. 1 is a vertical cross-sectional view illustrating a liquid processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure has been made by taking these factors into consideration. An object of the present disclosure is to provide a liquid processing apparatus, a liquid processing method and a storage medium having the method recorded therein, in which a processing liquid may be suppressed from being re-attached to a substrate which has been subjected to a liquid processing.

A liquid processing apparatus according to the present disclosure includes: a substrate holding unit configured to horizontally hold a substrate, a rotation driving unit configured to rotate the substrate holding unit on a vertical axis, a processing liquid supply unit configured to supply a processing liquid to the substrate during the rotation of the substrate, an upper guide ring and a lower guide ring, which are configured to be rotated together with the substrate holding unit, to surround the substrate held by the substrate holding unit, to be arranged vertically to overlap each other with a gap therebetween, and to guide the processing liquid scattered from the substrate, and a rotating cup configured to be rotated together with the substrate holding unit, and to receive and downwardly guide the processing liquid guided by the upper guide ring and the lower guide ring.

The above described liquid processing apparatus may have characteristics below.

(a) The bottom surface of the upper guide ring is disposed at a higher position than the bottom surface of the substrate held by the substrate holding unit, and the top surface of the lower guide ring is disposed at a lower position than the top surface of the substrate.

(b) The outer circumferences of the upper guide ring and the lower guide ring are obliquely slanted downward.

(c) The rotating cup is accommodated inside an annular outer cup, and the annular outer cup has an upper wall portion configured to cover the rotating cup from the upper side, and an opening having a smaller diameter than the substrate is formed at the top side central portion of the upper wall portion. In addition, the upper wall portion is formed in a truncated conical shape. Alternatively, in the top side of the rotating cup, a truncated conical cover member is provided. The truncated conical cover member is configured be rotated together with the substrate holding unit and having an opening of which the diameter is smaller than the diameter of the substrate at the top side central portion of the truncated conical cover member.

(d) Each of the upper guide ring and the lower guide ring has an inner circumferential surface, which faces the side circumferential surface of the substrate, with an end portion of an acute angle.

(e) The gap between the upper guide ring and the lower guide ring becomes narrower toward an outer circumferential side.

(f) At least one of the bottom surface of the upper guide ring and the top surface of the lower guide ring is formed with a linear protrusion which is configured to guide the processing liquid introduced into the gap between the upper guide ring the lower guide ring to the outside.

According to the present disclosure, the upper guide ring and the lower guide ring are vertically arranged around a rotating substrate, and the airflow and the processing liquid are guided from the rotating substrate toward the lateral side. Accordingly, the processing liquid may be discharged to a position that is spaced apart from the substrate, and the processing liquid may be suppressed from forming mists to be re-attached to the substrate.

The configuration of the liquid processing apparatus according to an exemplary embodiment of the present disclosure will be described with reference to FIGS. 1 and 2. As illustrated in FIG. 1, the liquid processing apparatus includes a disc-shaped support plate 21 provided with a plurality of support members 23 configured to horizontally support a wafer W; and a rotating shaft 22 connected to the bottom surface of support plate 21 and extending vertically.

A pulley 33 is provided at the bottom end side of rotating shaft 22, and a rotating motor 31 is disposed at one side of pulley 33. A rotation driving unit 30 is configured by winding a driving belt 32 around pulley 33 and a rotating shaft of rotating motor 31 which rotates support plate 21 about a vertical axis. Rotating shaft 22 is fixed via a bearing 34 to a base plate 110 on which the liquid processing apparatus is disposed.

Support plate 21 has a central portion that is cut out in a circular shape, and a lift shaft 25 vertically extending through the inside of rotating shaft 22 is disposed within the cut-out portion. A liquid flow path 27 configured to supply a processing liquid to a rear surface (bottom surface) of wafer W is formed within lift shaft 25. Also, a liquid supply unit 24 is provided at the upper end of lift shaft 25. Liquid supply unit 24 is provided with an opening, and the processing liquid flowing through liquid flow path 27 flows out through the opening. Liquid supply unit 24 gets wider in a bowl shape. Liquid supply unit 24 constitutes a processing liquid supply unit configured to supply the processing liquid to the rear surface of wafer W.

On the slop of liquid supply unit 24 getting wider in a bowl shape, for example, three support pins 26 are provided which protrude from the top surface of support plate 21 to support wafer W from the rear side of wafer W. Meanwhile, an elevating mechanism 35 is connected to the bottom end of lift shaft 25 to raise lift shaft 25 from the upper surface of support plate 21 so that wafer W may be transferred between an external wafer transfer mechanism and support pins 26.

At the peripheral edge of support plate 21, for example, three support members 23 are provided to be spaced apart from each other in a circumferential direction of support plate 21. Support members 23 are L-shaped actuating pieces and are attached to support plate 21 in a state where a support portion 232 that forms a short side of the L shape of each support member 23 and supports wafer W extends upward. Each of support members 23 is configured to be rotatable about a pivot shaft 231 and biased to come down toward the outside in the diametrical direction of support plate 21. Then, when wafer W supported by lift shaft 25 is lowered, the peripheral edge of wafer W comes into contact with support portions 232, and support members 23 are rotated about pivot shaft 231. Then, wafer W is supported by the front ends of support portions 232. A gap is formed between wafer W supported by support members 23 and support plate 21, and the processing liquid flows through the gap.

Also, at the peripheral edge of support plate 21, an annular rotating cup 51 is provided to be rotated together with support plate 21. As illustrated in the cross-sectional view of FIG. 1, rotating cup 51 includes: an upper wall portion 511 configured to cover the outer area of the peripheral edge of wafer W supported by support plate 21, from the upper side of wafer W; and a side wall portion 512 which extends downward to surround support plate 21 and the side circumferential surface of wafer W. As illustrated in FIGS. 1 and 2, upper wall portion 511 of rotating cup 51 is formed in a truncated conical shape which extends to be inclined upward and inward. At the top side central portion of upper wall portion 511, a circular opening 510 having a diameter larger than wafer W is formed.

For example, support plate 21, rotating shaft 22, and rotating cup 51 as described above, are accommodated within an annular outer cup 14. Outer cup 14 includes an upper wall portion 141 configured to cover rotating cup 51 from the upper side, and a cylindrical circumferential wall 142 configured to surround rotating cup 51 or support plate 21 from the lateral side. Circumferential wall 142 is provided on base plate 110 of a case on which the liquid processing apparatus is disposed. As illustrated in FIGS. 1 and 2, upper wall portion 141 of outer cup 14 is formed in a truncated conical shape which extends to be inclined upward and inward. At the top side central portion of upper wall portion 141, a circular opening 140 having a diameter larger than wafer W is formed. Then, opening 510 in rotating cup 51 and opening 140 in outer cup 14 are arranged vertically to overlap each other to form a flow path as described below through which a downflow of clean air flows.

On the inner wall surface of circumferential wall 142, an annular partitioning wall 15 is provided which extends toward the lower side of the peripheral edge of support plate 21. As illustrated in FIG. 1, partitioning wall 15 is formed with a convex portion 151 of a mountain shape in cross-section on the upper surface thereof, and is disposed in such a manner that the upper end of convex portion 151 is positioned in the vicinity of the bottom surface side of the peripheral edge of support plate 21. Convex portion 151 serves to suppress the processing liquid scattered from wafer W from entering an exhaust area at the lower side of support plate 21. Also, partitioning wall 15 is provided with a drain tube 171 configured to discharge the processing liquid collected between circumferential wall 142 and convex portion 151.

In the inside of partitioning wall 15, a cylindrical inner wall portion 161 is disposed to surround either the circumference of rotating shaft 22 or bearing 34 described above. Inner wall portion 161 upwardly extends in the vicinity of the bottom surface of support plate 21 from base plate 110. Inner wall portion 161 serves to inhibit the gas containing the mists of the processing liquid from entering the area where rotating shaft 22 and bearing 34 are arranged.

As described above, between circumferential wall 142 and inner wall portion 161 which are formed in a double cylindrical shape, the top surface of base plate 110 is covered with a lower plate portion 162. Lower plate portion 162 is provided with a drain tube 172 configured to discharge the processing liquid collected on lower plate portion 162, and provided with an exhaust tube 173 configured to exhaust the airflow introduced into the space surrounded by support plate 21, partitioning wall 15, lower plate portion 162 and inner wall portion 161. Exhaust tube 173 is connected to an exhaust unit (not illustrated), and performs the exhaustion of the interior of the liquid processing apparatus (the space within a case 11 to be described below).

The liquid processing apparatus according to the present exemplary embodiment alternately supplies various kinds of processing liquids to the surface of wafer W, thereby performing liquid processing on the surface. Examples of a chemical liquid used for processing liquid may include, for example, SC-1 (a mixed aqueous solution of ammonia and hydrogen peroxide) for removing organic pollutants or particles attached to the surface of wafer W, DHF (Diluted HydroFluoric acid) for removing native oxides formed on the surface of wafer W. However, the present disclosure is not limited to any particular kind of chemical liquids.

The liquid processing apparatus includes a liquid nozzle 411 configured to supply a chemical liquid or a rinse liquid such as DIW (DeIonized Water) to a central portion of the front surface (top surface) of rotating wafer W, and an IPA nozzle 412 configured to supply a processing liquid (IPA) that is supplied when the spin drying of wafer W is performed. Liquid nozzle 411 and IPA nozzle 412 correspond to the processing liquid supply unit of the present liquid processing apparatus.

Liquid nozzle 411 and IPA nozzle 412 are provided at the bottom surface side of a nozzle block 42, and nozzle block 42 is attached to the front end of a nozzle arm 43. The base end of nozzle arm 43 is supported by a rotation driving unit 44, and nozzle block 42 may be moved between a position above the central portion of wafer W (illustrated by a solid line in FIG. 2) and a position laterally retreated from the position above wafer W (illustrated by a broken line in FIG. 2).

Also, rotation driving unit 44 is supported by an elevating mechanism 45. When the processing liquid is supplied, nozzle arm 43 is moved down, thereby positioning liquid nozzle 411 or IPA nozzle 412 in the vicinity of wafer W. This suppresses liquid nozzle 411 or IPA nozzle 412 from interfering with upper wall portion 141 or rotating cup 51.

Also, the present disclosure is not limited to the case where liquid nozzle 411 and IPA nozzle 412 are provided in common nozzle block 42. Nozzles 411 and 412 may be provided in their dedicated nozzle blocks or moving mechanisms, respectively.

In nozzle arm 43 or nozzle block 42, liquid flow paths (not illustrated) respectively connected to liquid nozzle 411 and IPA nozzle 412 are provided.

The flow path connected to liquid nozzle 411 is connected to tanks of respective processing liquids (chemical liquid and DIW), and to a DIW supply unit 62 and a chemical liquid supply unit 63 which are provided with a flow control mechanism. Then, by opening and closing opening/closing valves V2 and V3 provided in connecting pipelines that connect the liquid flow path to respective processing liquid supply units 62 and 63, the respective processing liquids may be alternately supplied from liquid nozzle 411 to wafer W.

The liquid flow path connected to IPA nozzle 412 is connected to a tank of IPA (solvent), and an IPA supply unit 61 provided with a flow control mechanism. By opening and closing an opening/closing valve V1 provided in connecting pipeline that connects the liquid flow path to IPA supply unit 61, the IPA may be supplied from IPA nozzle 412 to wafer W.

As illustrated in FIG. 1, for example, support plate 21, rotating shaft 22, support members 23, rotating cup 51, outer cup 14, nozzle block 42, nozzle arm 43, and rotation driving unit 44, which have been described above, are accommodated within common case 11. At the upper portion of case 11, a diffusion space 13 is formed which is configured to diffuse clean air supplied from the outside to the entire surface of a top plate member 12 of case 11. The clean air diffused into diffusion space 13 may be supplied to the inside of case 11 through multiple supply holes 121 formed in top plate member 12, thereby forming the down flow of the clean air within case 11.

Also, in a side wall of case 11, an opening/closing door (not illustrated) is provided. By opening the opening/closing door, the external wafer transfer mechanism may be introduced into case 11.

Figure 3:
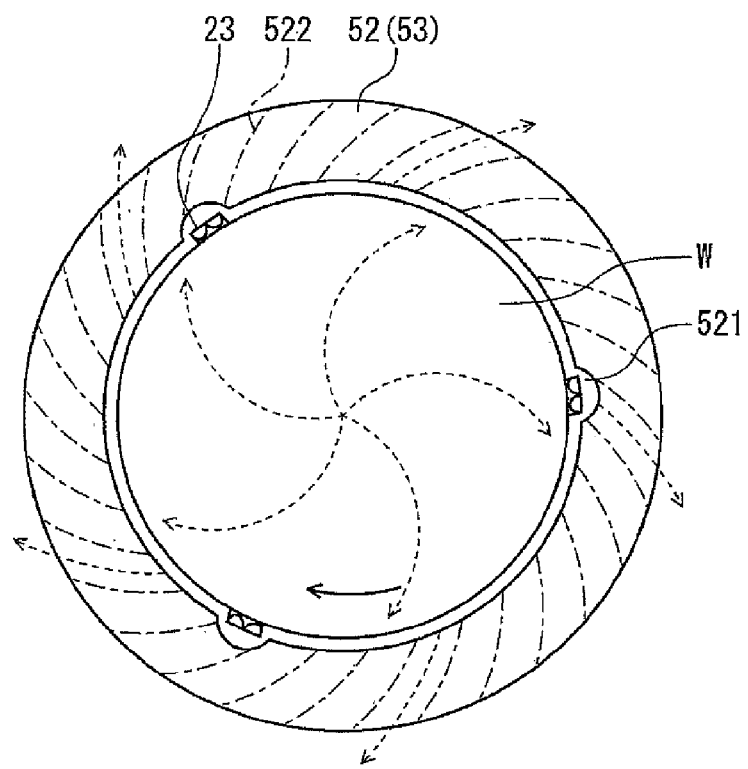
FIG. 3 is a plan view illustrating a wafer and a guide ring surrounding the wafer.
Figure 4:
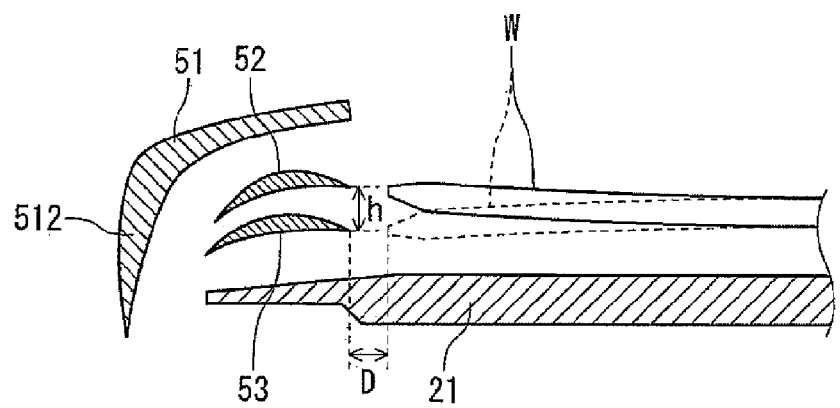
FIG. 4 is a vertical cross-sectional view illustrating arrangement positions of a rotating cup, an upper guide ring and a lower guide ring.

The above described liquid processing apparatus includes an upper guide ring 52 and a lower guide ring 53 which are configured to guide the processing liquid scattered from wafer W toward the lateral side of wafer W. As illustrated in FIGS. 3 and 4, upper guide ring 52 and lower guide ring 53 are annular members which are provided to surround wafer W supported by support plate 21 from the lateral circumferential side. Lower guide ring 53, upper guide ring 52 and rotating cup 51 arranged in this order from bottom to top are spaced apart from each other while being supported by support members (not illustrated). The support members are provided to be spaced apart from each other in the circumferential direction of support plate 21.

As illustrated in FIG. 4, each of upper guide ring 52 and lower guide ring 53 has an inner circumferential side with an end portion at an acute angle, the inner circumferential side facing the side circumferential surface of wafer W. Accordingly, it is difficult for the processing liquid scattered from wafer W to bounce or produce mists even if the processing liquid collides with the end portion. Meanwhile, in order to downwardly guide the processing liquid passed from the gap between upper guide ring 52 and lower guide ring 53, the outer circumference of each of upper guide ring 52 and lower guide ring 53 is curvedly formed in such a manner that the bottom surface of upper guide ring 52 and the top surface of lower guide ring 53 are obliquely slanted downward.

A distance D from the outer circumferential surface of wafer W held by support plate 21 to the inner circumferential sides of upper guide ring 52 and lower guide ring 53 is set to be in the range from about 0.5 mm to 3.0 mm. Herein, upper guide ring 52 and lower guide ring 53 are disposed at a position in the vicinity of wafer W in such a manner that the processing liquid flowing from the surface or the rear surface of wafer W may flow into the gap between upper guide ring 52 and lower guide ring 53. Also, the height h of the gap between upper guide ring 52 and lower guide ring 53 is set to be in the range from about 1.5 mm to 5.0 mm. Here, the processing liquid or the airflow of clean air flows in the gap, thereby exhibiting Bernoulli Effect. This allows the processing liquid to be effectively introduced into the gap. Also, the height of the gap between upper guide ring 52 and lower guide ring 53 becomes narrower as approaching the outer circumference side of guide rings 52 and 53. Thus, the processing liquid or the airflow introduced into the gap may be discharged at a flow rate higher than that a flow rate at the inflow.

Also, in order for the processing liquid scattered from wafer W to the periphery of wafer W to be easily guided to the gap, it is preferable that the bottom surface of upper guide ring 52 is disposed at a position higher than the height of the bottom surface of wafer W, and also the top surface of lower guide ring 53 is disposed at a position lower than the height of the top surface of wafer W.

As illustrated in FIG. 4, when the vertical cross-sectional shapes of upper guide ring 52 and lower guide ring 53 are curved, the height position of the bottom surface of upper guide ring 52 and the height position of the top surface of lower guide ring 53 indicate height positions of the surfaces of end portions of inner circumferential sides facing the wafer W, respectively.

Figure 5:
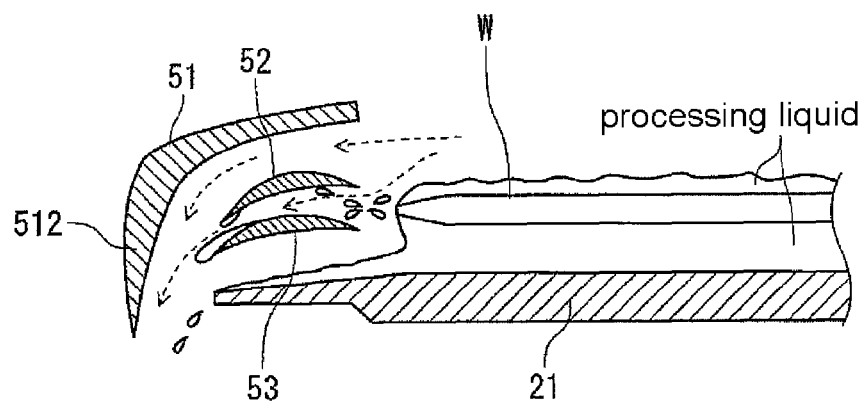
FIG. 5 is a vertical cross-sectional view illustrating the effects of the upper guide ring and the lower guide ring.

In the present exemplary embodiment, upper guide ring 52 and lower guide ring 53 are disposed in such a manner that when wafer W with no flexure is held on support plate 21, the height position at the center in the thickness direction of wafer W coincides with the height position at the center of the gap between upper guide ring 52 and lower guide ring 53 (see FIG. 5).

As illustrated in the plan view of FIG. 3, upper guide ring 52 and lower guide ring 53 have inner circumferential portions formed with notches 521 configured to avoid interference with support members 23 provided in support plate 21. Also, as illustrated by dashed dotted lines in FIG. 3, at least one of the bottom surface of upper guide ring 52 and the top surface of lower guide ring 53 is formed with linear protrusions 522. Linear protrusions 522 are configured in such a manner that, when spiral stream of a gas or a processing liquid formed on the surface of rotating wafer W enters the gap, the gas or the processing liquid can be guided outward. In the present exemplary embodiment, linear protrusions 522 extend in the spiral direction of the spiral stream.

Figure 2:
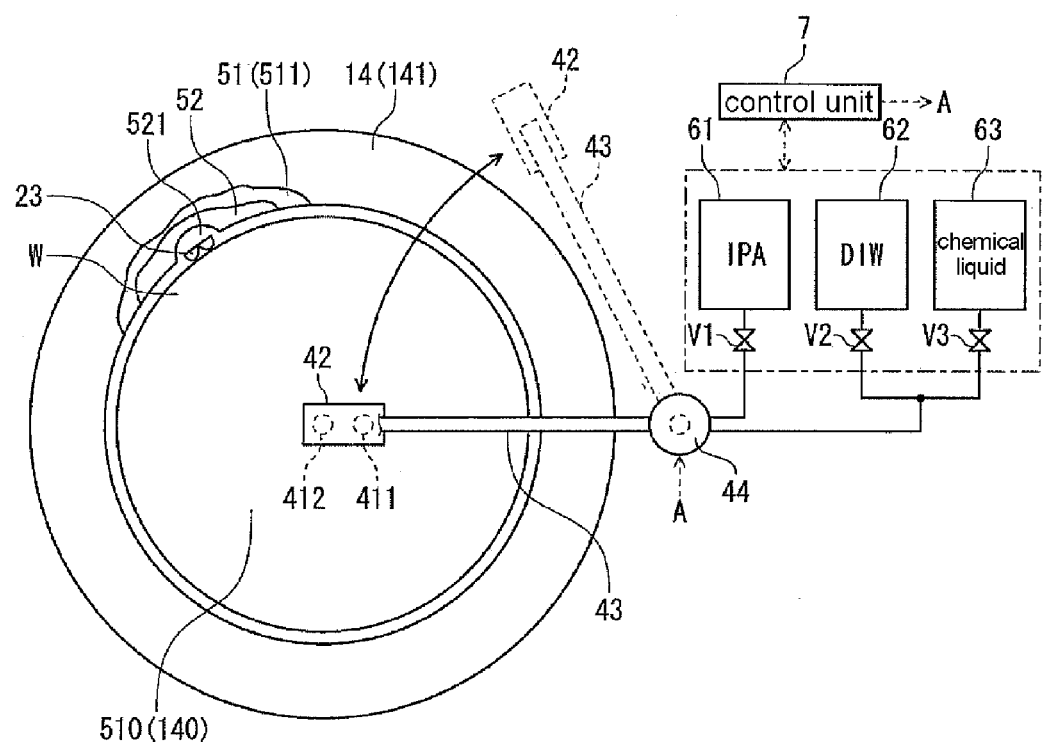
FIG. 2 is a plan view illustrating the liquid processing apparatus.

The above described liquid processing apparatus is connected to a control unit 7, as illustrated in FIGS. 1 and 2. Control unit 7 includes, for example, a computer (not illustrated) provided with a CPU and a storage unit. In the storage unit, a program having a group of steps (commands) for controlling the operation of the liquid processing apparatus is recorded. The operation includes the steps of holding carried-in wafer W on support plate 21, alternately supplying processing liquids to the surface of rotating wafer W based on a predetermined schedule, performing a liquid processing and a drying processing, and carrying out wafer W. This program is stored in a storage medium such as, for example, a hard disc, a compact disc, a magneto-optical disc, and a memory card, and is installed to the computer therefrom.

The effect of the present liquid processing apparatus will be described. The liquid processing apparatus stands by in a state where nozzle block 42 is retreated to the outside of outer cup 14 and support plate 21 is stopped. Then, when the external wafer transfer mechanism introduces a fork on which wafer W is held up to a position above support plate 21, lift shaft 25 is raised above the opening of outer cup 14, and crosses the fork. Then, wafer W is transferred onto support pins 26 of lift shaft 25.

After the fork is retreated from the position above support plate 21, lift shaft 25 is moved down, thereby disposing wafer W on support members 23 of support plate 21. Then, rotating motor 31 is operated, thereby rotating wafer W on support plate 21. When the rotating speed of wafer W arrives at a predetermined level, nozzle block 42 is moved to a position above the central portion of wafer W.

Then, a chemical liquid is supplied from liquid nozzle 411 for a predetermined time period to perform a liquid processing on the surface (top surface) of wafer W. The supplied chemical liquid is diffused from the central portion of wafer W toward the peripheral edge by the effect of centrifugal force. Then, in the area in contact with the chemical liquid, the liquid processing of wafer W is carried out. When the liquid processing by the chemical liquid is completed, the processing liquid to be supplied from liquid nozzle 411 is changed to DIW. Then, a rinse processing is performed to wash out the chemical liquid on the surface of wafer W. Also, as desired, various kinds of processing liquids may be supplied to the rear surface (bottom surface) of wafer W.

In this manner, when predetermined chemical liquid processings have been performed by alternately changing the kinds of chemical liquids by performing the chemical liquid processings and rinse processings alternately IPA is supplied from IPA nozzle 412 to wafer W after the last rinse processing. Then, the supply of IPA is stopped while wafer W is being continuously rotated so that the IPA may be scattered and thus, dried wafer W may be obtained.

When the spin drying of IPA is completed, nozzle block 42 is retreated from the position above wafer W, and rotation of wafer W is stopped. Then, lift shaft 25 is raised to lift wafer W, completely processed wafer W is transferred to the external wafer transfer mechanism, and then, lift shaft 25 is moved down and awaits the carry-in of following wafer W.

Hereinafter, descriptions will be made as to the behavior of the processing liquid and the effects of upper guide ring 52 and lower guide ring 53 in a state where the processing liquids (chemical liquid, DIW, IPA) are supplied to wafer W.

A processing liquid diffused from the surface of wafer W to the peripheral edge flows along the slope of the bevel and is slantly scattered downward, as illustrated in FIG. 5.

The gap between upper guide ring 52 and lower guide ring 53 is opened at a position where the processing liquid scattered from wafer W reaches. The processing liquid scattered from the surface of wafer W reaches, for example, the top surface of lower guide ring 53 and then flows within the gap by being guided by lower guide ring 53. Then, the processing liquid flowing from the gap flows downward by being guided by side wall portion 512, is collected in the space between circumferential wall 142 and convex portion 151 as illustrated in FIG. 1, and then is discharged from drain tube 171.

Also, on the surface of rotating wafer W, the clean air supplied to case 11 forms spiral stream as illustrated by broken-lined arrows in FIGS. 3 and 5, and flows from the central portion side to the peripheral edge side of wafer W. Since a part of this airflow flows into the gap, the processing liquid scattered from wafer W may be easily introduced into the gap due to Bernoulli effect of the airflow.

Also, since linear protrusions 522 are formed on upper guide ring 52 or lower guide ring 53, the force of a gas or a processing liquid may be increased while the gas or the processing liquid is flowing out from the gap to side wall portion 512.

The processing liquid scattered from the surface of wafer W as described above is guided outward through the gap between upper guide ring 52 and lower guide ring 53. Accordingly, the processing liquid slantly scattered downward along the bevel may be suppressed from forming mists by colliding with support plate 21 or the processing liquid flowing on the top surface of support plate 21.

Then, the scattered processing liquid flows through the inside of the gap and drops from wafer W to be downwardly discharged into an area where the exhaust is performed. Thus, mists formed as the processing liquid by colliding with side wall portion 512 may be suppressed from being returned to the inner area where wafer W is disposed.

Also, the height position at the center in the thickness direction of wafer W is arranged at the height position of the center of the gap between upper guide ring 52 and lower guide ring 53. Thus, even in a case where upward flexure (illustrated by a solid line in FIG. 4) or downward flexure (illustrated by broken line in FIG. 4) occurs in the peripheral edge of wafer W, the processing liquid may easily flow into the gap.

Further, since the upper wall portion 511 or 141 of rotating cup 51 or outer cup 14 is formed in a truncated conical shape, a sudden change in the flowing direction of airflow flowing along upper wall portion 511 or 141 may be suppressed. Accordingly, a back flow may be suppressed so that the re-attachment of mists to wafer W may be avoided.

Meanwhile, when the processing liquid is supplied to the rear surface (bottom surface) of wafer W from liquid supply unit 24 provided in lift shaft 25, the processing liquid is diffused within the gap between wafer W and support plate 21 due to the effect of centrifugal force. A part of the processing liquid reaching the peripheral edge of wafer W, flows along the slope of the bevel and is slantly scattered upward, as illustrated in FIG. 5. Also, a remaining processing liquid is guided to the top surface of support plate 21 and scattered from the peripheral edge of support plate 21 to side wall portion 512.

The gap between upper guide ring 52 and lower guide ring 53 is opened at the position where the processing liquid scattered from wafer W reaches. The processing liquid scattered from the surface of wafer W reaches, for example, the bottom surface of upper guide ring 52, and then flows within the gap by being guided by upper guide ring 52. Then, the processing liquid flowing from the gap flows downward by being guided by side wall portion 512, and then is discharged from drain tube 171 in the same manner in the processing liquid scattered from the surface of wafer W.

The other effects are the same as those applied to the effects applied when a processing liquid is supplied to the front surface (top surface of wafer W), i.e., the effect that allows a processing liquid to be introduced into the gap between upper guide ring 52 and lower guide ring 53 as airflow flows into the gap, the effect that allows the processing liquid to easily flow into the gap between upper guide ring 52 and lower guide ring 53 by arranging the height position of the center in the thickness direction of wafer W at the height position of the center of the gap, the effect that suppress the re-attachment of mists to wafer W by suppressing the back flow of airflow by forming upper wall portions 511, 141 of rotating cup 51 and outer cup 14 in a truncated conical shape, the effects that allows the force of a gas or processing liquid to be increased while the gas or processing liquid is flowing out from the gap by forming linear protrusions 522.

As described above, as the processing liquid scattered from the rear surface of wafer W is guided outward through the gap between upper guide ring 52 and lower guide ring 53, the processing liquid slantly upwardly scattered along the bevel may be suppressed from forming mists by colliding with rotating cup 51 and the mists may be suppressed from being re-attached to wafer W. Also, the scattered processing liquid drops from wafer W to be downwardly discharged into an area where exhaust is performed. Thus, the mists formed as the processing liquid colliding with side wall portion 512 may be suppressed from being returned to the inner area where wafer W is disposed. This effect is also the same as that in the case where the processing liquid is supplied to the front surface (top surface) of wafer.

In addition, the processing liquid scattered from the front surface (top surface) or the rear surface (bottom surface) of wafer W may not all flow into the gap. In a case where a part of the processing liquid flows along the top surface of upper guide ring 52 or the bottom surface of lower guide ring 53 toward side wall portion 512 of rotating cup 51, the effect of suppressing the processing liquid forming mists by being entrained in the turbulent flow formed in the circumference of wafer W as in a conventional guide ring may be obtained.

With the liquid processing apparatus according to the present embodiment, the following effects can be obtained. Since upper guide ring 52 and lower guide ring 53 are arranged vertically with each other around rotating wafer W, and the airflow and a processing liquid are guided toward the lateral side from rotating wafer W, the processing liquid may be discharged to a position apart from wafer W and the processing liquid flowing along upper guide ring 52 and lower guide ring 53 may be suppressed from forming mists to be re-attached to wafer W.

Figure 6:
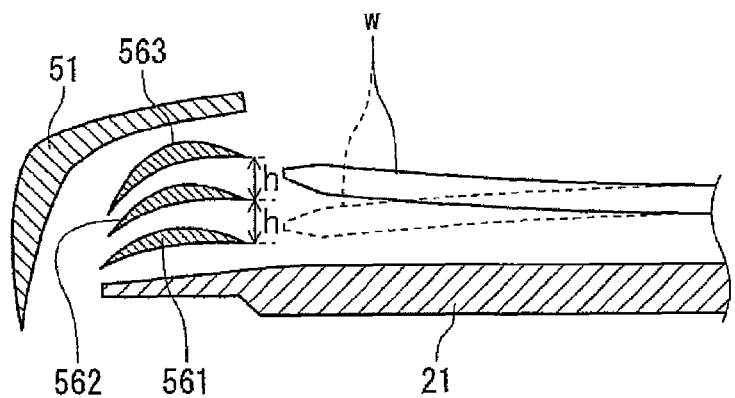
FIG. 6 is a vertical cross-sectional view illustrating a guide ring according to another exemplary embodiment.

Although two guide rings 52 and 53 are provided in the above described exemplary embodiments, the number of guide rings may be three or more. FIG. 6 illustrates an exemplary embodiment where three guide rings (a first guide ring 561, a second guide ring 562, and a third guide ring 563) arranged in this order from the bottom are vertically provided to be spaced apart from each other.

In this case, in first guide ring 561 and second guide ring 562 which are vertically adjacent to each other, first guide ring 561 corresponds to the lower guide ring, and second guide ring 562 corresponds to the upper guide ring. Also, in second guide ring 562 and third guide ring 563, second guide ring 562 corresponds to the lower guide ring, and third guide ring 563 corresponds to the upper guide ring.

By disposing three or more guide rings 561 to 563 vertically in this manner, it is easy to guide the processing liquid scattered from wafer W to a gap in guide rings 561 to 563 even in a case where the flexure width of wafer W is further increased when wafer W has a further larger size.

Meanwhile, even in a case where the distance between third guide ring 563 at the upper side and first guide ring 561 at the lower side is set to be large in correspondence with the increase of flexure width of wafer W, second guide ring 562 may be disposed between guide ring 563 and first guide ring 561 so as to maintain the height h of each of gaps within a range from about 1.0 mm to 5.0 mm so that the effect of suppressing the flow rate of gas from being reduced while the gas is being introduced into these gaps, thereby maintaining the introduction of the gas into the gap.

However, the gap between the upper guide ring and the lower guide ring may be opened at a position deviating from the lateral side of wafer W supported by support plate 21. This is because the opening position has a range that allows the processing liquid scattered from wafer W to be introduced into the gap since airflow flows into the gap even in a case where the bottom surface of the upper guide ring is disposed at a lower position than the bottom surface of wafer W, or the top surface of the lower guide ring is disposed at a higher position than the top surface of wafer W.

Figure 7:
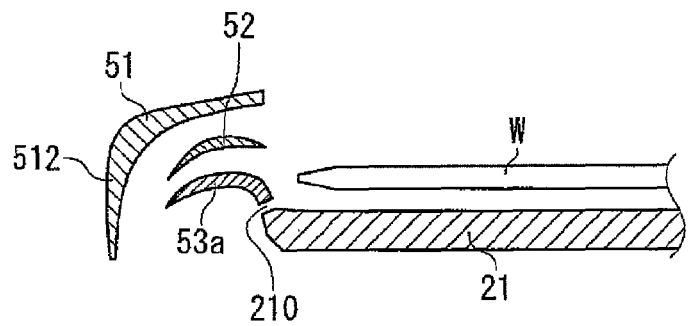
FIG. 7 is a vertical cross-sectional view illustrating a guide ring according to a yet another exemplary embodiment.

Also, support plate 21 and lower guide ring 53 may be integrally configured. FIG. 7 illustrates an exemplary embodiment in which a lower guide ring 53a is formed by bending the peripheral edge area of support plate 21 in a stepped shape. In this exemplary embodiment, a drain groove 210 is formed at a portion where the peripheral edge of support plate 21 rises. The drain groove 210 is configured to discharge the processing liquid diffused from the rear surface of wafer W.

Figure 8:
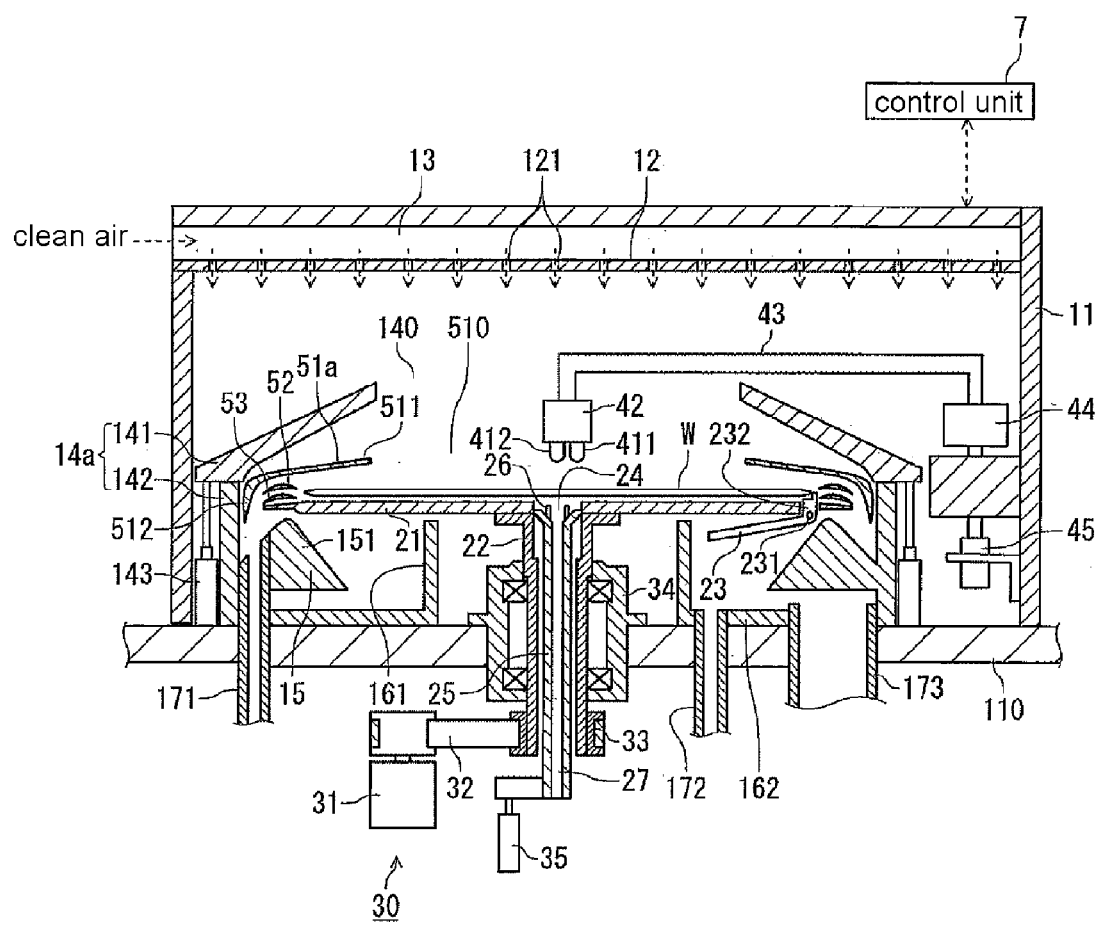
FIG. 8 is a vertical cross-sectional view illustrating a second liquid processing apparatus.
Figure 9:
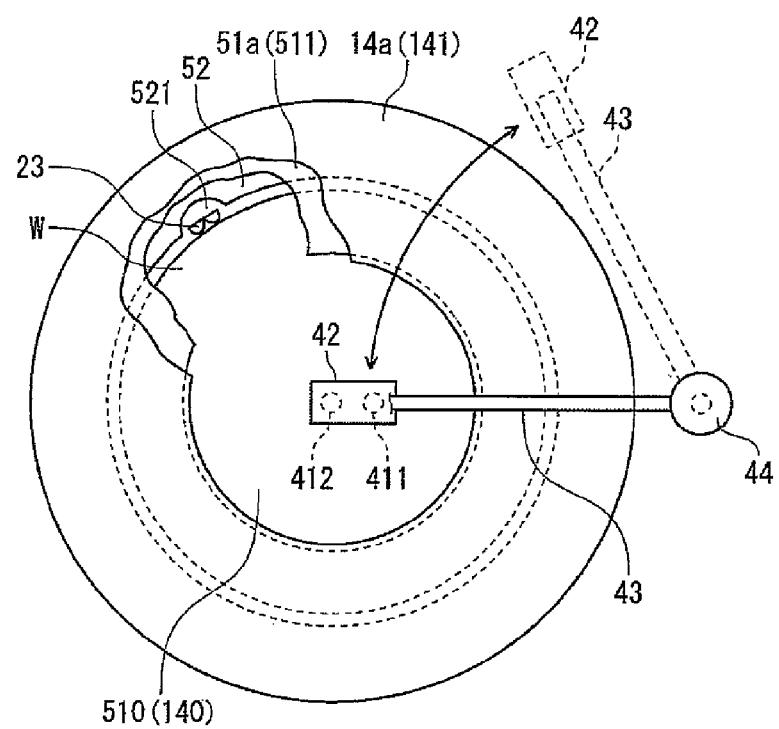
FIG. 9 is a plan view illustrating the second liquid processing apparatus.

Next, another exemplary embodiment of the liquid processing apparatus will be described in which the liquid processing apparatus is configured in such a manner that upper wall portion 511 of rotating cup 51 and upper wall portion 141 of outer cup 14 extend inward. As illustrated in FIGS. 8 and 9, in the present exemplary embodiment, upper wall portion 511 of a rotating cup 51a extends inward in such a manner that it may cover the upper side of the peripheral edge of wafer W supported by support plate 21, and opening 510 has a smaller diameter than wafer W. Also, in the same manner, upper wall portion 141 of an outer cup 14a extends inward in such a manner that it may cover upper wall portion 511 of rotating cup 51a from the upper side, and opening 140 has a smaller diameter than wafer W.

Herein, when opening 510 or 140 formed in rotating cup 51a or outer cup 14a has a smaller diameter than wafer W, wafer W cannot be vertically passed through opening 510 or 140 when wafer W is transferred between the external wafer transfer mechanism and lift shaft 25. Thus, in the present exemplary embodiment, rotating cup 51a and outer cup 14a are provided with mechanisms 54, 55, 18, and 143 configured to retreat rotating cup 51a and outer cup 14a to the upper side of support plate 21 when W is transferred between the wafer transfer mechanism and lift shaft 25.

Figure 10:
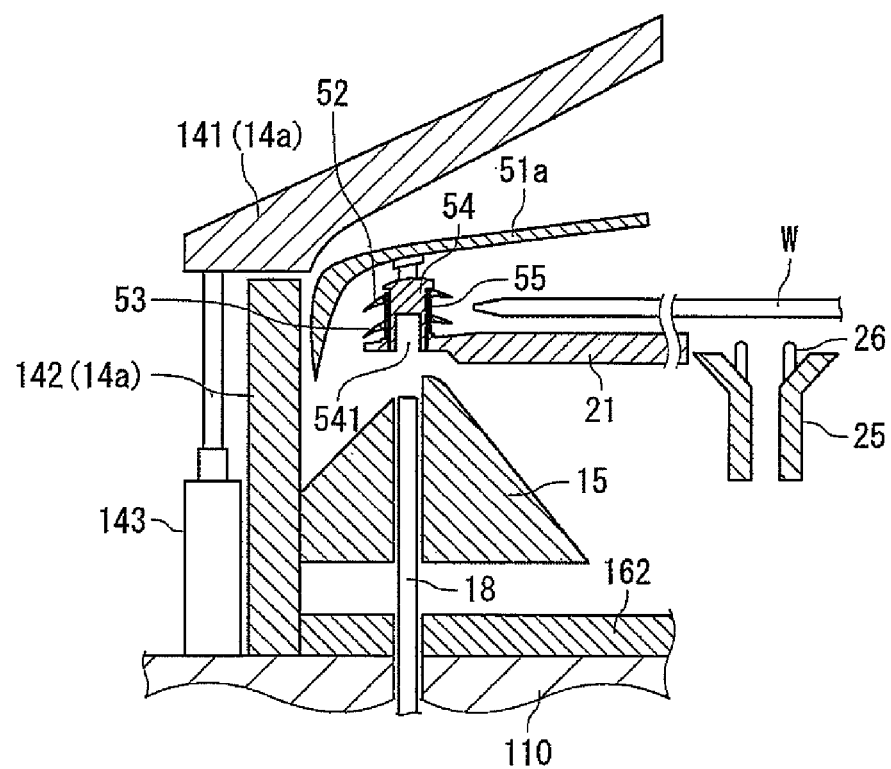
FIG. 10 is a first explanatory view illustrating an elevating mechanism of a rotating cup provided in the second liquid processing apparatus.
Figure 11:
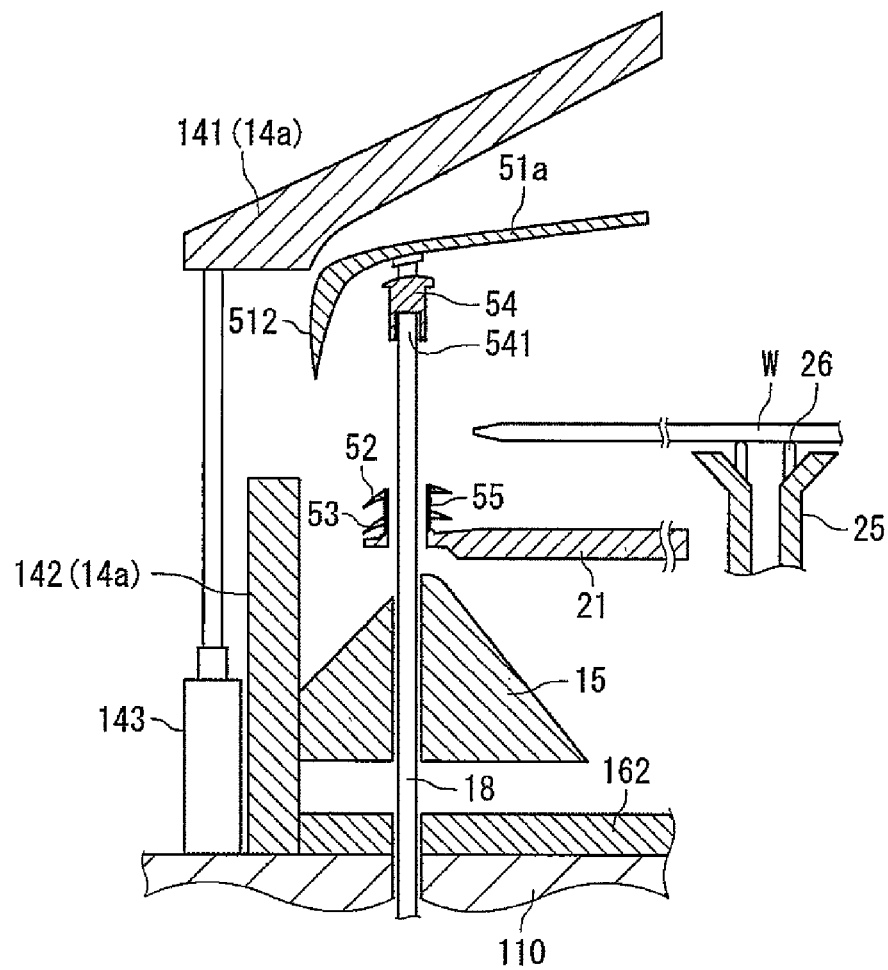
FIG. 11 is a second explanatory view illustrating the elevating mechanism of the rotating cup.

As illustrated in FIGS. 8, 10 and 11, in upper wall portion 141, an elevating mechanism 143 is provided which may move upper wall portion 141 between a processing position of covering the upper side of rotating cup 51a (see FIG. 10), and a retreat position above the processing position (see FIG. 11).

Meanwhile, rotating cup 51a is supported by a cylindrical support pipe 55 and a rod-shaped support pin 54 (see FIG. 10). Support pipe 55 is provided in such a manner that it upwardly extends from the peripheral edge at the top side of support plate 21. Support pin 54 is provided at the bottom side of rotating cup 51a and is inserted into support pipe 55 from the upper side. Support pipe 55, for example, is provided by using, for example, a support member that supports upper guide ring 52 and lower guide ring 53 in such a manner that upper guide ring 52 and lower guide ring 53 may be arranged to be vertically spaced apart from each other with a gap.

Support plate 21 and rotating cup 51a are provided with plural sets of support pipes 55 and support pins 54 to be spaced apart from each other in the circumferential direction. One support pin 54 is inserted into each support pipe 55 to support rotating cup 51a. Accordingly, even when rotating cup 51a is rotated together with support plate 21, the position of rotating cup 51a is not deviated.

In the bottom surface of each of the support pins 54, a concave portion 541 is formed, into which an elevating rod 18 may be inserted. Elevating rod 18 is raised or lowered through base plate 110, lower plate portion 162, and partitioning wall 15. In addition, as illustrated in FIG. 11, when elevating rod 18 is raised and inserted into concave portion 541 to lift rotating cup 51a, rotating cup 51a may be retreated from the position of covering support plate 21. The external wafer transfer mechanism enters the gap formed between the lower side of rotating cup 51a (side wall portion 512) and the top surface of support plate 21 to transfer wafer W to/from lift shaft 25.

Since opening 140 or 510 of outer cup 14a or rotating cup 51a has a smaller diameter than wafer W as described above, the flow rate of airflow passing through opening 140 or 510 may be increased such that the airflow is suppressed from flowing backward toward the outside of outer cup 14a. In addition, since the flow rate is increased when the airflow flows into the gap between upper guide ring 52 and lower guide ring 53, the processing liquid may be introduced with a stronger force. Further, since opening 140 or 510 is smaller than wafer W, a flow rate that is sufficient to suppress the back flow of airflow with a relatively small exhaust amount.

Figure 12:
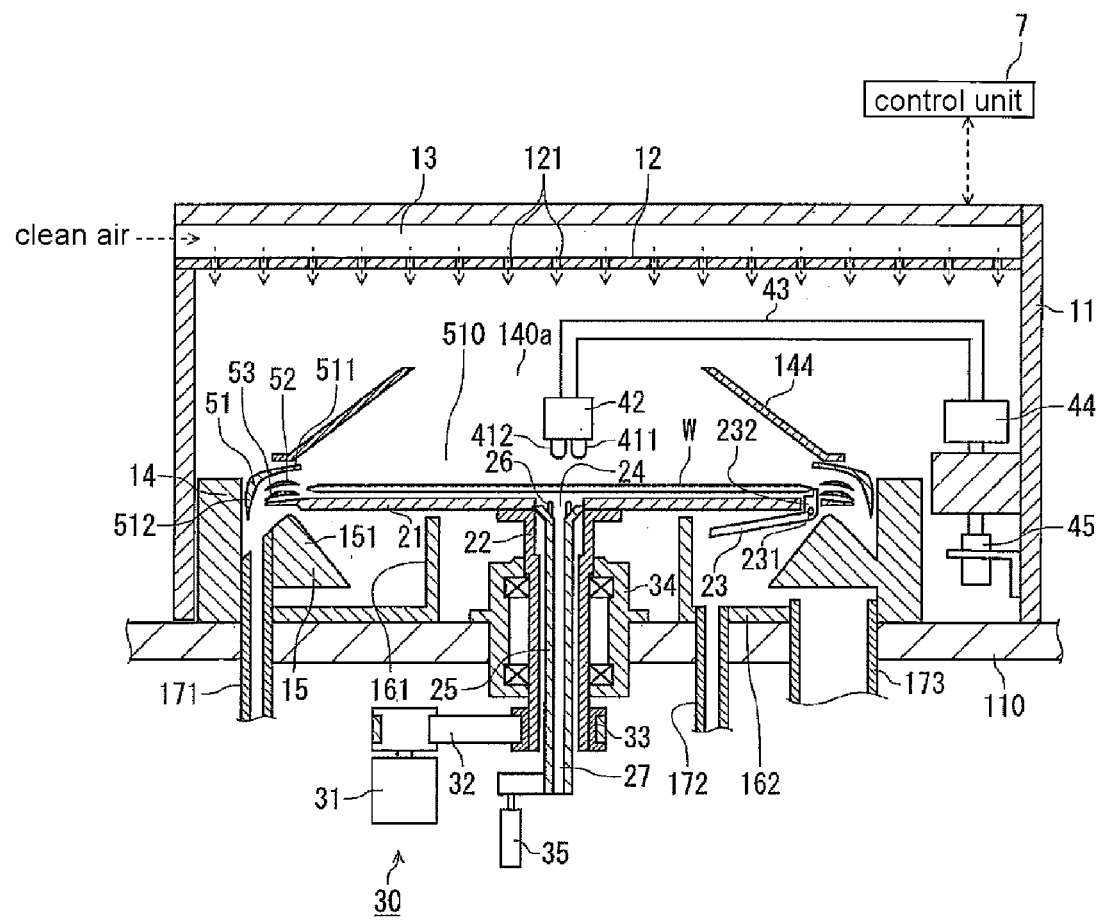
FIG. 12 is a vertical cross-sectional side view illustrating a third liquid processing apparatus.

Also, the method of increasing the rate of airflow by passing the airflow through opening 140 or 510 having a smaller diameter than wafer W is not limited to the case where upper wall portion 141 or 511 of outer cup 14a or rotating cup 51 is provided to extend downward and to cover the upper side of the peripheral edge of wafer W supported on support plate 21. For example, as illustrated in FIG. 12, a truncated conical cover 144 that is a truncated conical cover member rotated together with rotating cup 51 may be disposed at the upper side of rotating cup 51 and an opening 140a having a smaller diameter than wafer W may be provided at the central portion of the top side of truncated conical cover 144.

Figure 13:
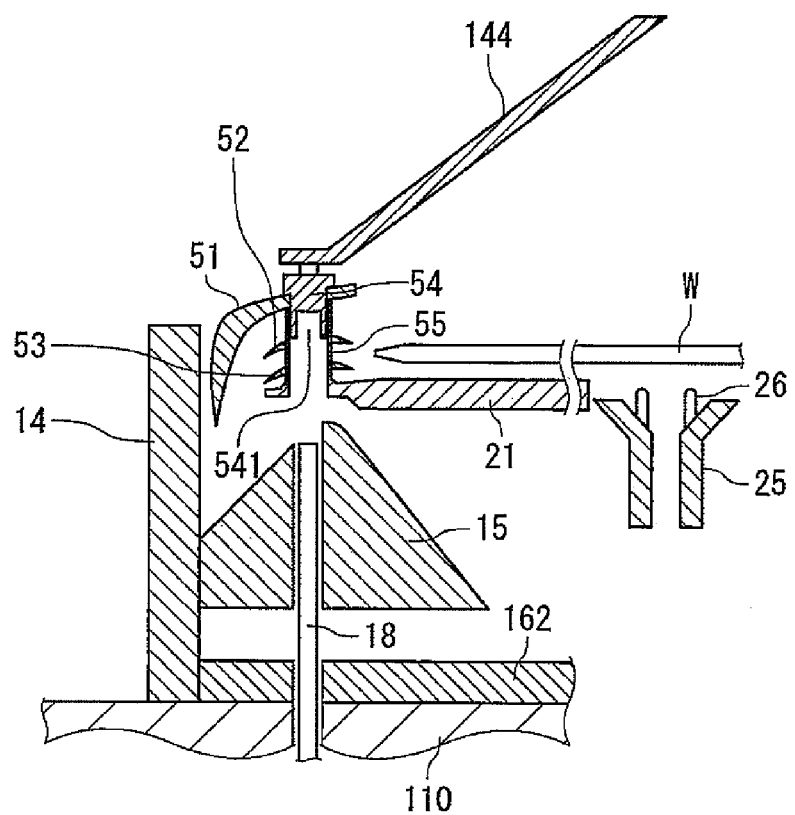
FIG. 13 is a first explanatory view illustrating an elevating mechanism of a truncated conical cover provided in the third liquid processing apparatus.
Figure 14:
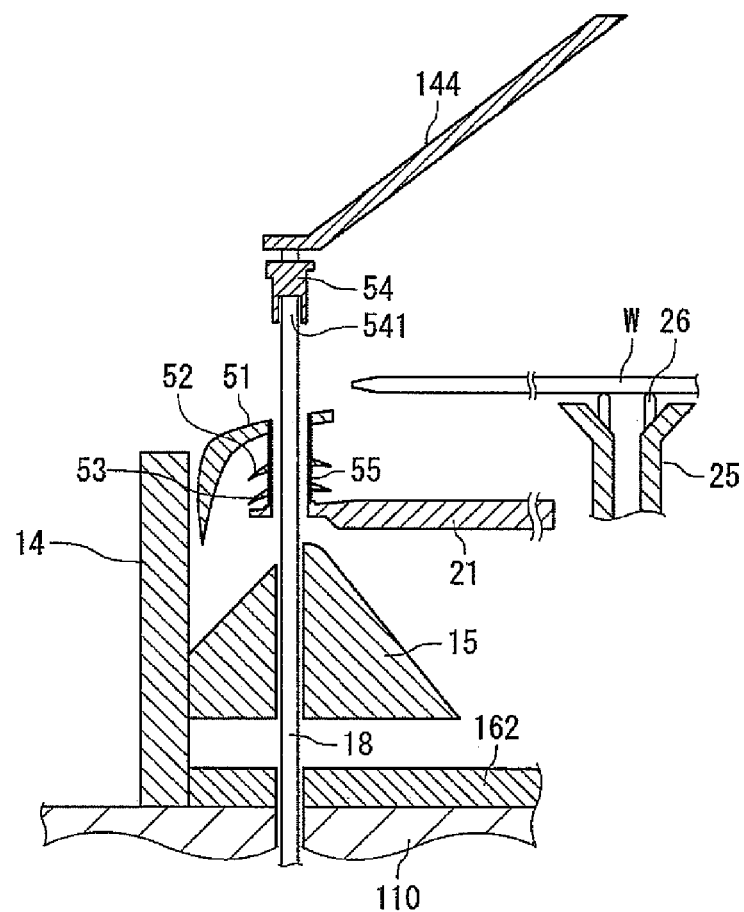
FIG. 14 is a second explanatory view illustrating the truncated conical cover.

In this case, for example, as illustrated in FIGS. 13 and 14, rotating cup 51, upper guide ring 52 and lower guide ring 53 are supported by support pipe 55 in such a manner that they are arranged to overlap vertically each other and to spaced apart from each other. In addition, in the same manner as in the exemplary embodiment of rotating cup 51 as illustrated FIGS. 8 to 11, support pin 54 provided at the bottom side of truncated conical cover 144 is inserted into support pipe 55 to support truncated conical cover 144 to be rotated together with support plate 21. Also, when wafer W is transferred, elevating rod 18 lifts truncated conical cover 144, thereby retreating truncated conical cover 144. Further, in the present exemplary embodiment, upper wall portion 141 may not be provided in outer cup 14.

Also in the embodiment where truncated conical cover 144 is provided, the flow rate of airflow passing through opening 140a is increased, thereby suppressing the airflow from flowing backward toward the outside of truncated conical cover 144 or outer cup 14 and strengthening the force of introducing the processing liquid into the gap between upper guide ring 52 and lower guide ring 53. In addition, small opening 140a contributes to the reduction of the exhaust amount. Further, the shape of the cover member provided on rotating cup 51 is not limited to the truncated conical shape. For example, opening 140a having a smaller diameter than wafer W may be provided at the central portion of the top of a polygonal pyramid such as, for example, a quadrangular pyramid.

Here, in a case where opening 140, 510 or 140a of upper wall portion 141, rotating cup 51, or truncated conical cover 144 has a smaller diameter than wafer W, the method of retreating upper wall portion 141 or rotating cup 51 from a position above support plate 21 when carrying in/out of wafer W is not limited to the above described exemplary embodiment. For example, upper wall portion 141, rotating cup 51 or truncated conical cover 144 may be grasped and from the upper side of support plate 21 by a robot arm.

In addition, it is not essential to provide both of rotating cup 51; 51a and outer cup 14; 14a. As desired, any one of rotating cup 51; 51a rotated together with wafer W and outer cup 14; 14a fixed on base plate 110 may be provided. When rotating cup 51; 51a is not provided, outer cup 14; 14a performs the role of a cup that receives and downwardly guides the processing liquid From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
    a substrate holding unit configured to horizontally hold a substrate;
    a rotation driving unit configured to rotate the substrate holding unit about a vertical axis;
    a processing liquid supply unit configured to supply a processing liquid to the substrate while the substrate is being rotated;
    a rotating cup including an upper wall portion configured to cover an outer area of a peripheral edge of the substrate and a side wall portion configured to extend downward; and
    an upper guide ring and a lower guide ring provided between the upper wall portion of the rotating cup and the substrate holding unit, and each configured to be rotated together with the substrate holding unit, to surround the substrate held by the substrate holding unit, to be arranged vertically to overlap with each other with a gap therebetween, and to guide the processing liquid scattered from the substrate,
    wherein the rotating cup is surrounded by a cylindrical circumference wall and configured to be rotated together with the substrate holding unit, and to receive and downwardly guide the processing liquid guided by the upper guide ring and the lower guide ring while surrounding the upper guide ring and the lower guide ring such that the processing liquid flows through a gap between the upper wall portion of the rotating cup and the upper guide ring and the gap between the upper guide ring and the lower guide ring, and then flows downward to an external cup,
    the upper guide ring and the lower guide ring are arranged in a vertical direction such that the gap between the upper guide ring and the lower guide ring is positioned at a center of a height position of the substrate in a thickness direction and becomes narrower as approaching an outer circumferential side while an outer circumference of each of the upper guide is crescent shaped such that each of a bottom surface of the upper guide ring and a top surface of the lower guide ring is obliquely slanted downward, and
    each of a height position of a top surface and a bottom surface of the upper guide ring and a height position of a top surface and a bottom surface of the lower guide ring is lower at the outer circumferential side than an inner side.

2. The liquid processing apparatus of claim 1, wherein the bottom surface of the upper guide ring is disposed at a position higher than the bottom surface of the substrate held by the substrate holding unit, and the top surface of the lower guide ring is disposed at a position lower than the top surface of the substrate.

3. The liquid processing apparatus of claim 1, wherein the outer circumferences of the upper guide ring and the lower guide ring are obliquely slanted downward.

4. The liquid processing apparatus of claim 1, wherein the rotating cup is accommodated inside an annular outer cup, the annular outer cup has an upper wall portion configured to cover the rotating cup from the above, and an opening having a diameter smaller than the diameter of the substrate is formed at a top side central portion of the upper wall portion.

5. The liquid processing apparatus of claim 4, wherein the upper wall portion is formed in a truncated conical shape.

6. The liquid processing apparatus of claim 1, wherein a truncated conical cover member is provided at a top side of the rotating cup, and the truncated conical cover member is configured to be rotated together with the substrate holding unit and having an opening of which the diameter is smaller than the diameter of the substrate at a top side central portion of the truncated conical cover member.

7. The liquid processing apparatus of claim 1, wherein each of the upper guide ring and the lower guide ring has an inner circumferential surface, which faces the side circumferential surface of the substrate, with an end portion of an acute angle.

8. The liquid processing apparatus of claim 1, wherein at least one of a bottom surface of the upper guide ring and a top surface of the lower guide ring is formed with a linear protrusion configured to guide the processing liquid introduced into the gap between the upper guide ring and the lower guide ring to an outside.

* * * * *